(12) United States Patent
Shi et al.

(10) Patent No.: US 9,124,231 B2
(45) Date of Patent: Sep. 1, 2015

(54) SOFT TURN-OFF FOR BOOST CONVERTERS

(71) Applicant: QUALCOMM Incorporated, San Diego, CA (US)

(72) Inventors: Song S Shi, San Diego, CA (US); Pengfei Li, San Diego, CA (US); Lennart Karl-Axel Mathe, San Diego, CA (US)

(73) Assignee: QUALCOMM, Inc., San Diego, CA (US)

( * ) Notice: Subject to any disclaimer, the term of this patent is extended or adjusted under 35 U.S.C. 154(b) by 281 days.

(21) Appl. No.: 13/752,282

(22) Filed: Jan. 28, 2013

(65) Prior Publication Data
US 2014/0210548 A1 Jul. 31, 2014

(51) Int. Cl.
| | |
|---|---|
| *H02M 3/158* | (2006.01) |
| *H03G 1/00* | (2006.01) |
| *H02M 1/088* | (2006.01) |
| H02M 1/36 | (2007.01) |
| H02M 1/00 | (2007.01) |

(52) U.S. Cl.
CPC .............. *H03G 1/0005* (2013.01); *H02M 1/088* (2013.01); *H02M 3/158* (2013.01); *H02M 2001/0045* (2013.01); *H02M 2001/0058* (2013.01)

(58) Field of Classification Search
CPC .. Y02B 70/1466; H02M 1/4225; H02M 1/36; H02M 3/156; H02M 3/1588
USPC ........................... 323/225, 268, 271, 272, 350
See application file for complete search history.

(56) References Cited

U.S. PATENT DOCUMENTS

| | | | |
|---|---|---|---|
| 6,091,297 A | 7/2000 | Bar-David et al. | |
| 6,249,111 B1 * | 6/2001 | Nguyen | ........................ 323/282 |
| 6,437,641 B1 | 8/2002 | Bar-David | |
| 6,492,867 B2 | 12/2002 | Bar-David | |
| 6,825,641 B2 * | 11/2004 | Pigott | ........................... 323/222 |
| 6,831,519 B2 | 12/2004 | Bar-David et al. | |
| 6,985,039 B2 | 1/2006 | Bar-David et al. | |

(Continued)

FOREIGN PATENT DOCUMENTS

| | | |
|---|---|---|
| EP | 1172923 A1 | 1/2002 |
| TW | 201112591 A | 4/2011 |

(Continued)

OTHER PUBLICATIONS

International Search Report and Written Opinion—PCT/US2014/012768—ISA/EPO—Jan. 27, 2015.

(Continued)

*Primary Examiner* — Gary L Laxton
(74) *Attorney, Agent, or Firm* — Fountainhead Law Group P.C.

(57) ABSTRACT

Techniques for reducing ringing arising from L-C coupling in a boost converter circuit during a transition from a boost ON state to a boost OFF state. In an aspect, during an OFF state of the boost converter circuit, the size of the high-side switch coupling a boost inductor to the load is gradually increased over time. In this manner, the on-resistance of the high-side switch is decreased from a first value to a second (lower) value over time, which advantageously reduces ringing (due to high quality factor or Q) when initially entering the OFF state, while maintaining low conduction losses during the remainder of the OFF state. Further techniques are provided for implementing the high-side switch as a plurality of parallel-coupled transistors.

20 Claims, 10 Drawing Sheets

(56) References Cited

U.S. PATENT DOCUMENTS

| | | | |
|---|---|---|---|
| 7,046,090 B2 | 5/2006 | Veinblat | |
| 7,257,384 B2 | 8/2007 | Bar-David et al. | |
| 7,482,789 B2 * | 1/2009 | Motomori et al. | 323/224 |
| 7,692,416 B2 | 4/2010 | Shimizu | |
| 7,710,203 B2 | 5/2010 | Bar-David et al. | |
| 7,782,132 B2 | 8/2010 | Plotnik et al. | |
| 7,899,417 B2 | 3/2011 | Elia | |
| 7,932,780 B2 | 4/2011 | Elia | |
| 7,994,769 B2 * | 8/2011 | Ohtake et al. | 323/283 |
| 8,089,253 B2 | 1/2012 | Murtojarvi | |
| 8,107,902 B2 | 1/2012 | Elia | |
| 8,193,860 B2 | 6/2012 | Cohen | |
| 8,217,634 B2 * | 7/2012 | Lu et al. | 323/271 |
| 2006/0255777 A1 | 11/2006 | Koertzen | |
| 2008/0265851 A1 * | 10/2008 | Zhang | 323/272 |
| 2009/0001949 A1 * | 1/2009 | Komori | 323/272 |
| 2009/0098846 A1 | 4/2009 | Elia | |
| 2010/0001703 A1 | 1/2010 | Williams | |
| 2010/0123442 A1 | 5/2010 | Peterson et al. | |
| 2011/0121805 A1 | 5/2011 | Mirea et al. | |
| 2012/0032658 A1 | 2/2012 | Casey et al. | |
| 2012/0068678 A1 * | 3/2012 | Hatae et al. | 323/272 |
| 2012/0268091 A1 * | 10/2012 | Takemae | 323/272 |

FOREIGN PATENT DOCUMENTS

| | | |
|---|---|---|
| TW | 201203822 A | 1/2012 |
| WO | 2008018276 A1 | 2/2008 |

OTHER PUBLICATIONS

Taiwan Search Report—TW103102308—TIPO—Apr. 8, 2015.
Taiwan Search Report (English translation)—TW103102308—TIPO—Apr. 8, 2015.
Taiwan Office Action from corresponding application No. 103102308 mailed Apr. 15, 2015.

* cited by examiner

SOFT TURN-OFF FOR BOOST CONVERTERS

BACKGROUND

1. Field

The disclosure relates to control schemes for boost converter circuitry.

2. Background

Boost converters are a type of switched-mode power supply designed to efficiently boost a supply voltage, e.g., a battery voltage of a system, from a first level to a second higher level. A boost converter typically includes a high-side switch and a low-side switch configured to alternately couple an inductor to an output voltage or to ground. The high-side and low-side switches may be configured to drive the output voltage to a predetermined target output voltage using any of a plurality of schemes known in the art, e.g., pulse-width modulation (PWM). When the boost converter is enabled or in an ON state, then the output voltage may be driven to a target output voltage higher than the supply voltage. When the boost converter is disabled or in an OFF state, then the output voltage may be coupled to the supply voltage.

In particular, during the transition from the ON state to the OFF state, the high-side switch of the boost converter may be turned on, thereby introducing a low-resistance path (i.e., through the high-side switch) between the inductor and a load coupled to the output voltage. This low resistance, combined with the instantaneous voltage step caused by turning on the high-side switch, may cause ringing in the output voltage and/or large peak current as the voltage and current settle to their final, post-transient values during the OFF state.

It would be desirable to provide techniques for reducing ringing and/or peak current during the transition between the boost converter ON and OFF states.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
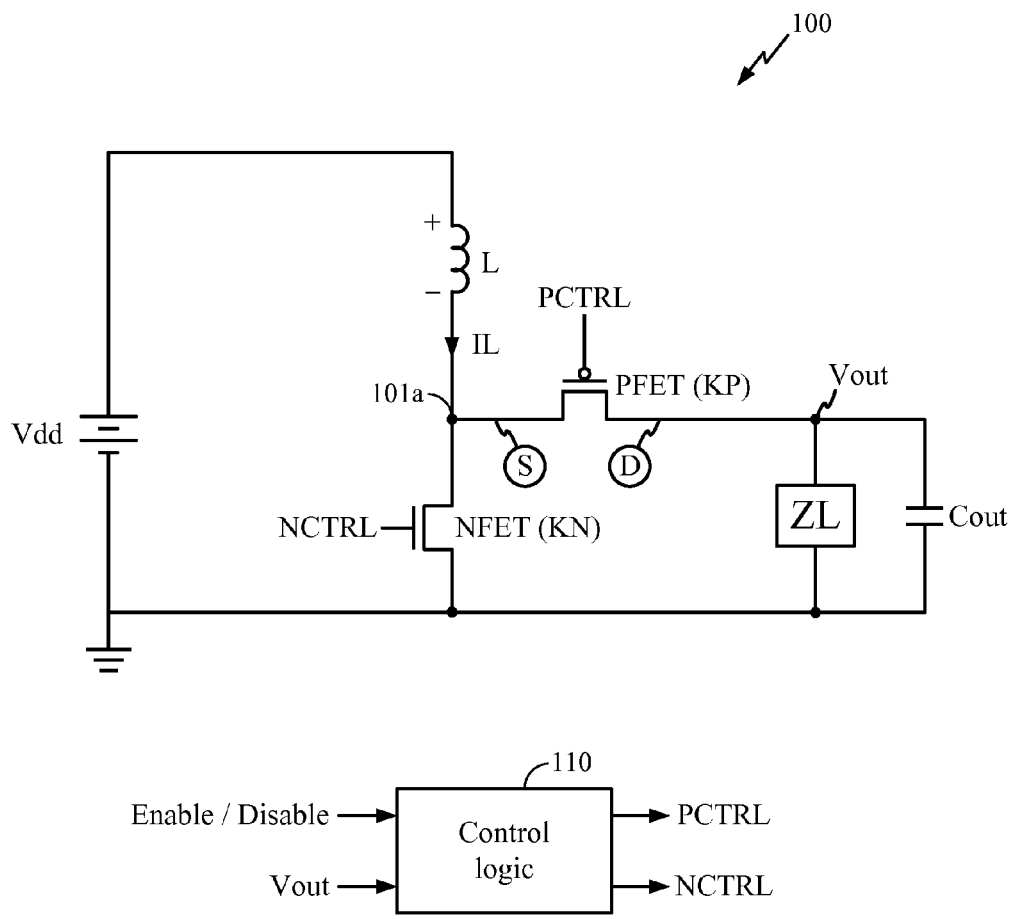
FIG. 1 illustrates a prior art implementation of a boost converter.

FIG. 1 illustrates a prior art implementation of a boost converter 100. Note FIG. 1 is shown for illustrative purposes only, and is not meant to limit the scope of the present disclosure to the particular boost converter topology shown.

In FIG. 1, the boost converter 100 includes switching transistors PFET (also denoted the "high-side switch") and NFET (also denoted the "low-side switch"). PFET selectively couples or decouples the inductor to or from an output voltage Vout, which is in turn coupled to a load ZL and capacitor Cout. NFET selectively couples or decouples the inductor to or from ground. A control logic block 110 receives as input signals the output voltage Vout, and further a signal indicating whether the boost converter is to be enabled or disabled, e.g., denoted Enable/Disable in FIG. 1. Block 110 generates control signals PCTRL and NCTRL to control the operation of the switching transistors PFET, NFET.

When the boost converter is enabled or in an ON state, then the control logic block 110 may control the switches to drive the output voltage Vout to a target output voltage higher than the supply voltage Vdd. For example, during a charging phase (e.g., of duration Ton) of a cycle (e.g., of duration T) of the ON state, NFET is on and PFET is off, and the switching node 101a couples the inductor L to ground through NFET. During a discharging phase (e.g., of duration Toff) of the ON state, PFET is on and NFET is off, and the switching node 101a thereby couples the inductor L to Vout. When it is desired to decrease the output voltage Vout during the ON state, Ton may be decreased (and Toff may be increased), which thereby reduces charging current IL to Vout by the inductor L. It will be appreciated that block 110 may adopt any of a variety of schemes known in the art to generate PCTRL and NCTRL to set Vout, e.g., techniques employing pulse-width modulation (PWM), pulse frequency modulation (PFM), etc.

When the boost converter is disabled or in an OFF state, then the control logic block 110 turns the PFET on and the NFET off to couple the output voltage Vout to the supply voltage Vdd via PFET. For example, the boost converter may be disabled when it is not needed to drive the output voltage Vout to a level higher than Vdd.

A certain consideration arises when the boost converter 100 transitions from the ON state to the OFF state. In particular, during such a transition, PFET may be switched from being off to being on, to couple the source voltage Vdd to the output voltage Vout. Immediately after PFET is turned on during this transition, a low resistance will be present across the drain and source of PFET, i.e., between node 101a and the node supporting the output voltage Vout, corresponding to the drain-to-source on-resistance (or "RDSon") of PFET. Note in FIG. 1, the drain and source of PFET are labeled as a circled "D" and a circled "S," respectively, although it will be appreciated that the designation of drain and source may also be reversed from that shown. To increase the efficiency of the boost converter 100, RDSon should be kept low, such that current IL from the inductor L may be efficiently transferred to the load ZL and storage capacitor Cout without being dissipated through RDSon. However, a low value of RDSon also increases the quality factor (or Q) of the LC-circuit formed by the series combination of the inductor L and the capacitor Cout, which may undesirably cause ringing and/or other disruptive phenomena when the boost converter 100 initially transitions from the ON state to the OFF state.

Figure 2:
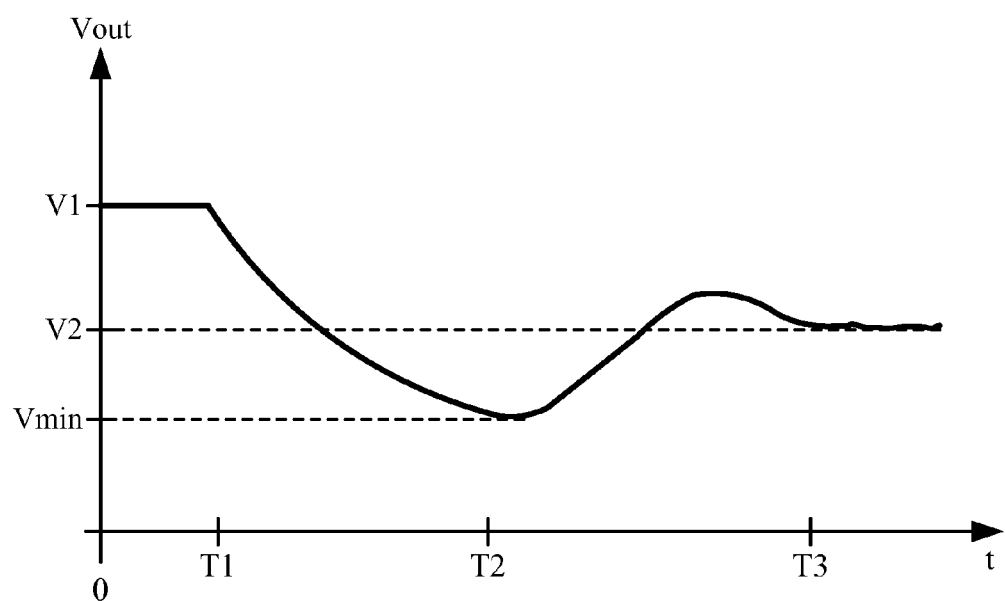
FIG. 2 illustrates an exemplary instance of the output voltage Vout illustrating principles of the present disclosure.

FIG. 2 illustrates an exemplary instance of the output voltage Vout illustrating principles of the present disclosure. Note FIG. 2 is shown for illustrative purposes only, and is not meant to limit the scope of the present disclosure in any way, e.g., to any particular voltage levels, sample quality factor (Q), or operating regime for a boost converter, shown or implied.

In FIG. 2, at time T1, the boost converter 100 transitions from the ON state to the OFF state, i.e., the boost converter 100 is turned off, and PFET is turned on. Responsive to PFET being turned on, the output voltage Vout is seen to drop from a level of V1 (e.g., a boosted value for Vout higher than Vdd) starting at time T1 to a level of V2 (e.g., Vdd) near time T3. Due to high Q of the system resulting from the relatively low RDSon of PFET, however, there may be significant "ringing" present in the output voltage Vout, as seen in the voltage Vout undershooting V2 and decreasing to as low as Vmin<V2 at time T2, prior to settling around V2 near T3. It will be appreciated that, corresponding to the ringing in Vout, there will be similar ringing in the current IL through the inductor L.

In light of the discussion hereinabove, it would be desirable to provide techniques for improving the turn-off characteristics of boost converters, while maintaining overall power efficiency.

Figure 3:
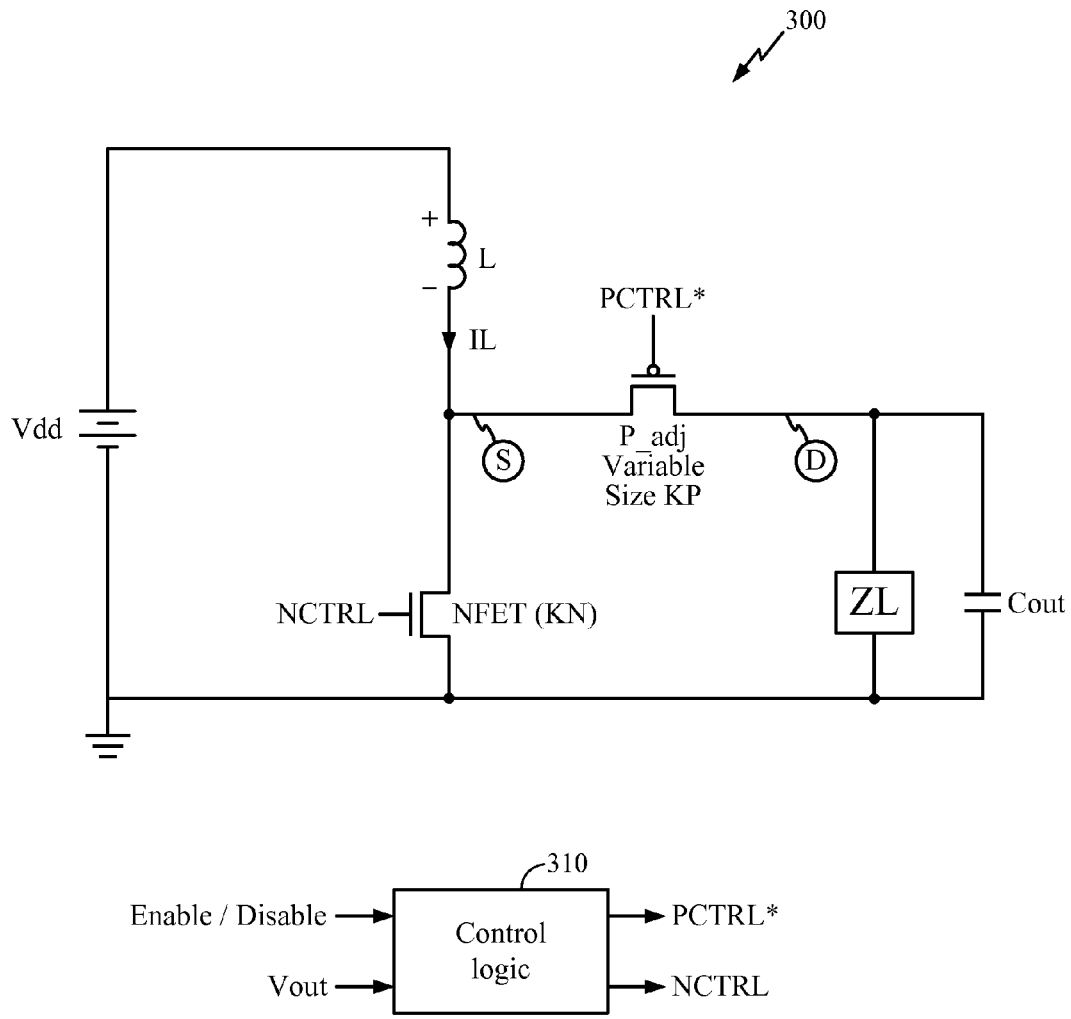
FIG. 3 illustrates an exemplary embodiment of a boost converter according to the present disclosure.

FIG. 3 illustrates an exemplary embodiment 300 of a boost converter according to the present disclosure. Note FIG. 3 is shown for illustrative purposes only, and is not meant to limit the scope of the present disclosure.

In FIG. 3, the high-side switch is implemented as a transistor P_adj having an adjustable or variable size KP. In an exemplary embodiment, when P_adj is turned on by the gate control voltage PCTRL* during the OFF state, its size KP is adjusted over time from a first size Size1 to a second size Size2, wherein Size1<Size2. The adjustment of KP over time may readily be accomplished using techniques known to one of ordinary skill in the art, e.g., by using a size control voltage (not shown in FIG. 3) such as further described hereinbelow with reference to FIG. 6. By increasing the size of P_adj over time when P_adj is turned on, it is expected that the drain-to-source on-resistance of P_adj will correspondingly decrease over time during the OFF state. As further described hereinbelow, this advantageously reduces ringing in the LC circuit, due to the higher RDSon when P_adj is initially turned on.

In FIG. 3, control logic block 310 is provided to generate the gate control voltages PCTRL* and NCTRL, given knowledge of, e.g., the output voltage Vout, and the timing of the ON and OFF states from the Enable/Disable signal. In an exemplary embodiment, PCTRL* specifies not only when P_adj is to be turned on or off, but also specifies the size of P_adj when P_adj is turned on. For example, PCTRL* may include two or more gate control voltages for controlling two or more parallel-coupled PMOS transistors (not shown in FIG. 3) for implementing P_adj. Alternatively, in certain exemplary embodiments (not shown), P_adj may be implemented using, e.g., a series combination of a switch and a continuously variable resistance element, in which case PCTRL* may be an analog voltage that controls the variable resistance to continuously decrease the variable resistance over time during the OFF state. In yet another exemplary embodiment, PCTRL* may be a simple on/off voltage, and the size adjustments may be separately made by circuitry associated with the switch P_adj (not shown in FIG. 3). In yet alternative exemplary embodiments, it will be appreciated that adjustment of RDSon may also be accomplished using other techniques, e.g., adjustment of the amplitude of the gate overdrive voltage PCTRL* applied to P_adj over time. Such alternative exemplary embodiments are contemplated to be within the scope of the present disclosure.

Figure 4:
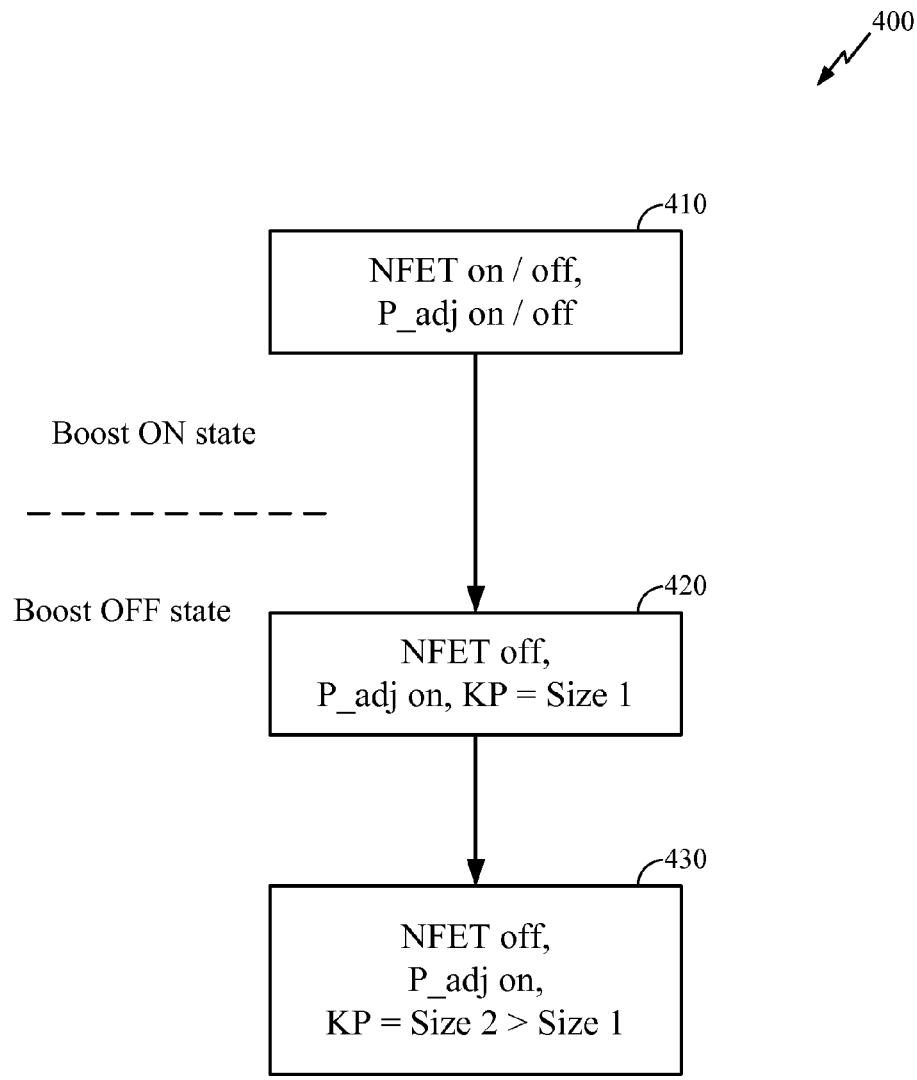
FIG. 4 illustrates an exemplary embodiment of a method according to the present disclosure.

FIG. 4 illustrates an exemplary embodiment of a method 400 according to the present disclosure. Note the method 400 is shown for illustrative purposes only, and is not meant to limit the scope of the present disclosure.

In FIG. 4, at block 410, during the ON state, NFET and P_adj are alternately turned on or off, switching between the charging and discharging phases based on the control signals PCTRL* and NCTRL generated by control logic block 310.

From block 410 to block 420, the ON state transitions to the OFF state. In particular, in the OFF state, P_adj is on, NFET is off, inductor current is discharged, and Vout returns to a level V2, wherein V2 equals the boost input Vdd minus the I-R (i.e., current times resistance) drop across P_adj. In particular, NFET is turned off, and P_adj is turned on with a first size Size1. In an exemplary embodiment, Size1 is chosen such that the drain-to-source turn-on resistance RDSon of P_adj has a large enough value to prevent significant ringing in the output voltage Vout. In other words, by initially providing a relatively large RDSon for P_adj at the beginning of the OFF state, the quality factor (Q) of the circuit may initially be kept low. In an exemplary embodiment, the size of P_adj may be maintained at Size1 for a predetermined time interval Δt.

At block 430, the size KP of P_adj is increased from Size1 to Size2, wherein Size1<Size2. In an exemplary embodiment, Size2 is chosen such that RDSon of P_adj has a relatively small value, thus minimizing the series resistance between the input and the load ZL and reducing the voltage drop from the input to the output during the OFF state.

Figure 5:
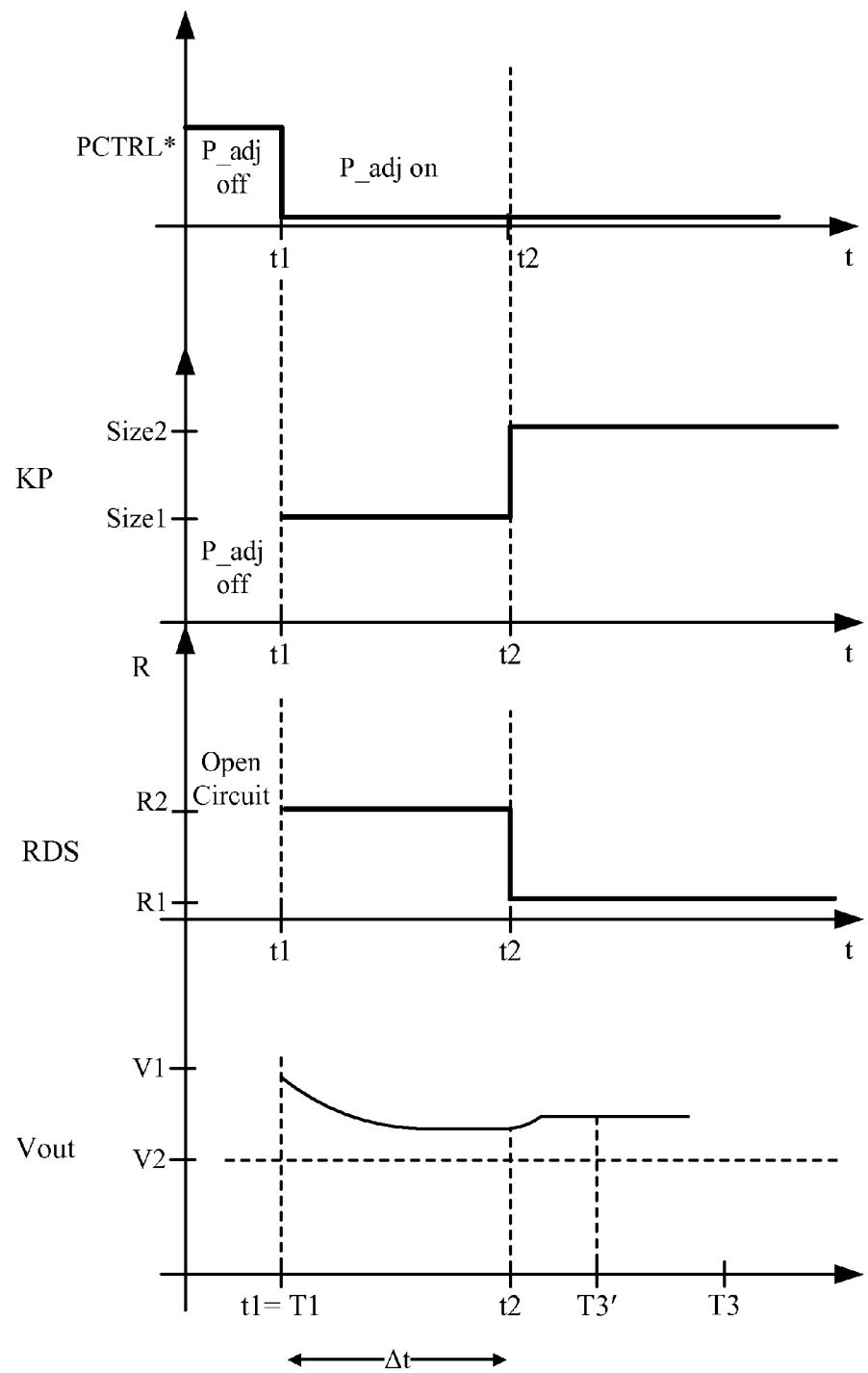
FIG. 5 illustrates exemplary signal waveforms present in an exemplary embodiment of the present disclosure, wherein the size of P_adj is adjusted according to the method in FIG. 4.

FIG. 5 illustrates exemplary signal waveforms present in an exemplary embodiment of the present disclosure, wherein the size of P_adj is adjusted according to the method 400 in FIG. 4. Note FIG. 5 is shown for illustrative purposes only, and is not meant to limit the scope of the present disclosure to any exemplary signal waveforms shown. Further note that the waveforms in FIG. 5 are not necessarily drawn according to scale. In the exemplary embodiment shown in FIG. 5, PCTRL* corresponds to a simple on/off logical signal controlling whether P_adj is on or off, and does not additionally indicate the size of P_adj when turned on. It will be appreciated however that in light of the exemplary signal waveforms shown in FIG. 5, one of ordinary skill in the art may readily derive alternative exemplary embodiments wherein PCTRL* includes, e.g., a plurality of signals controlling not only the on/off state of P_adj but also the size of P_adj when turned on. Such alternative exemplary embodiments are contemplated to be within the scope of the present disclosure.

In FIG. 5, at time t1, PCTRL* is seen to transition from a high to low voltage, such that P_adj is turned on at t1. It will be appreciated that this corresponds to the transition from the ON state to the OFF state, as illustrated between blocks 410 and 420 in FIG. 4. At time t1, the size KP of P_adj is set to a first value Size1. In the exemplary embodiment shown, KP may be maintained at the first value Size1 from t1 to t2 (e.g., for an interval having duration $\Delta t$). It will also be seen in FIG. 5 that the drain-to-source resistance (RDS) of P_adj is equal to a value R2 from t1 to t2, corresponding to the effective on-resistance of P_adj when its size KP is equal to Size1.

Subsequently, at t2, the size KP of P_adj is increased from the first value Size1 to a second value Size2 (greater than Size1). Accordingly, RDS of P_adj is seen to decrease from R2 to a lower value R1 at t2, due to the increased size of P_adj. It will be appreciated that reducing RDS at t2 advantageously reduces the voltage drop across P_adj. In an exemplary embodiment, $\Delta t$ may be chosen to allow enough time for Vout to settle to close to its final value. Note before t2, Vout=Vdd−ILoad*R2, and after t2, Vout=Vdd−ILoad*R1. Accordingly, Vout rises at t2, in response to RDS decreasing from R2 to R1.

During the interval from t1 to t2, as RDS is relatively high, the Q of the L-C circuit formed by L and Cout will be relatively low. Therefore, Vout will approach and settle at its final value without significant ringing.

Figure 6:
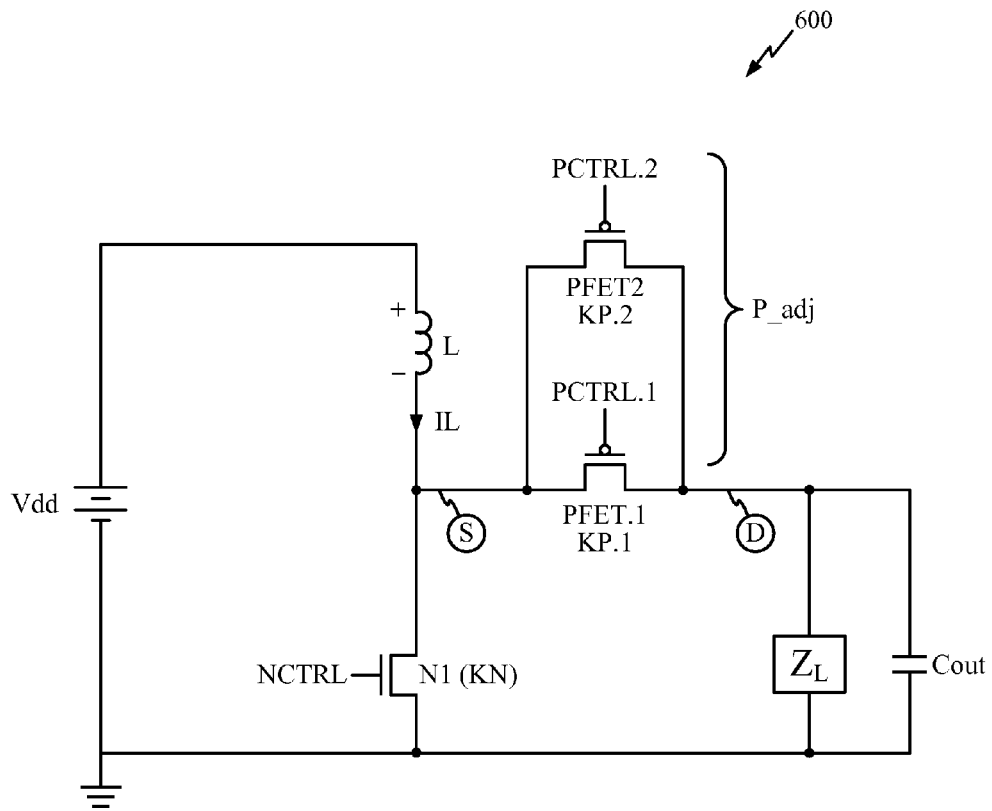
FIG. 6 illustrates an exemplary embodiment of the present disclosure, wherein variable size for P_adj is implemented using multiple parallel-coupled PMOS transistors.
Figure 6:
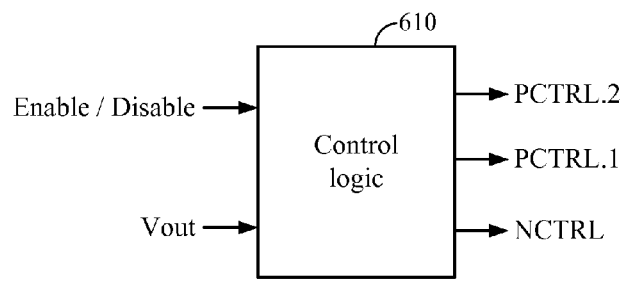

FIG. 6 illustrates an exemplary embodiment 600 of the present disclosure, wherein variable size for P_adj is implemented using multiple parallel-coupled PMOS transistors. Note FIG. 6 is shown for illustrative purposes only, and is not meant to limit the scope of the present disclosure to particular exemplary embodiments employing, e.g., two parallel-coupled PMOS transistors. It will be appreciated that providing a variable size for P_adj may readily be implemented using more than two parallel-coupled transistors, or alternative techniques not shown, and such alternative exemplary embodiments are contemplated to be within the scope of the present disclosure.

In FIG. 6, P_adj includes a first transistor PFET.1 having size KP.1 and a second transistor PFET.2 having size KP.2 coupled to control voltages PCTRL.1, PCTRL.2, respectively. In an exemplary embodiment, KP.1 is less than KP.2, in which case the size of P_adj may be progressively increased according to the techniques of the present disclosure by, e.g., first turning on PFET.1 and keeping PFET.2 off to achieve the first size (e.g., Size1), and subsequently turning on PFET.2 in addition to PFET.1 to achieve the second size (e.g., Size2). In an alternative exemplary embodiment, it will be appreciated that PFET.1 may instead be turned off when PFET.2 is turned on, since as long as Size2>Size1, then turning PFET.1 off would in such case still increase the overall size of P_adj.

A control logic block 610 is provided to generate the gate control voltages NCTRL, PCTRL.1, and PCTRL.2, given knowledge of, e.g., the output voltage Vout, and the timing of the ON and OFF states from the Enable/Disable signal. The duration of $\Delta t$ may be programmed into, e.g., a register (not shown in FIG. 6) in control logic block 610, to aid block 610 in appropriately setting the control voltages PCTRL.1 and PCTRL.2 over time.

Figure 7:
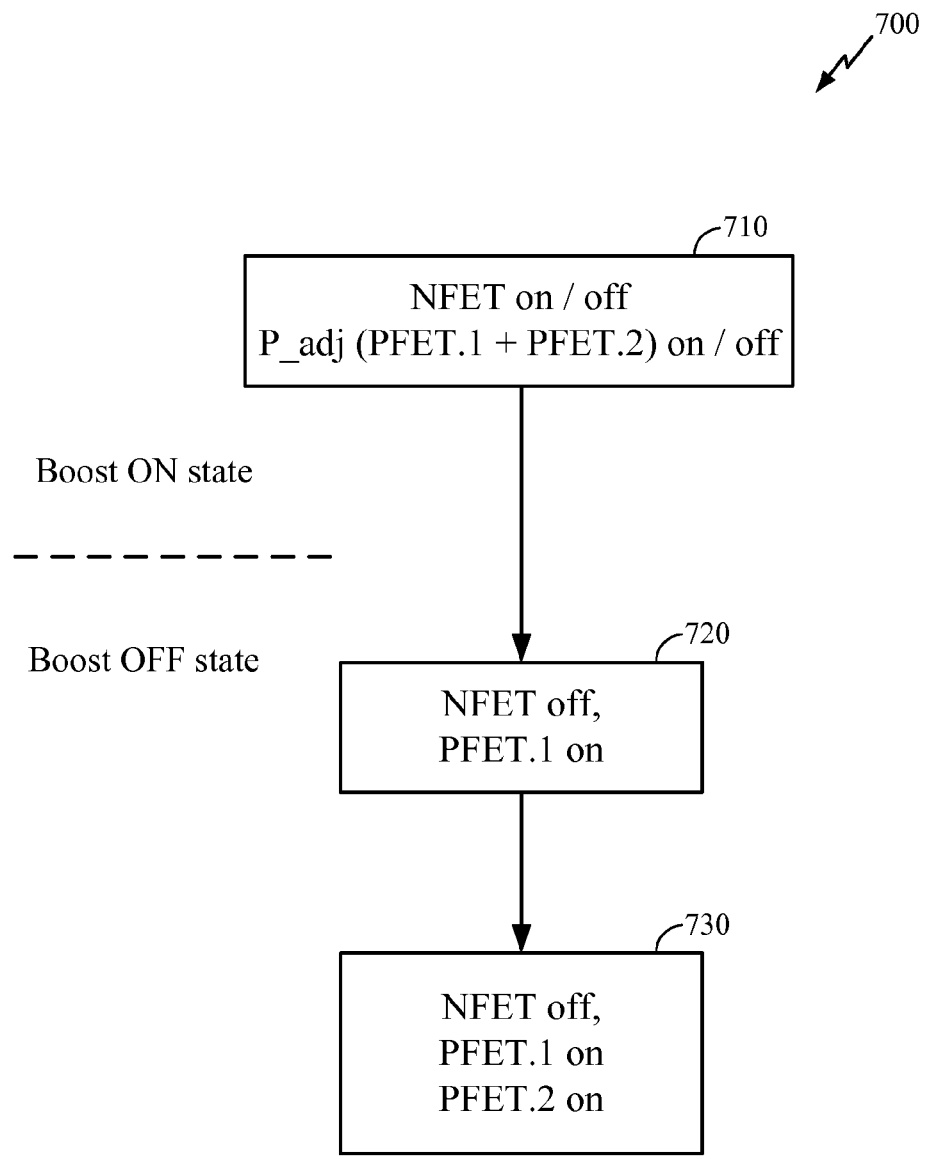
FIG. 7 illustrates an exemplary embodiment of a method for increasing the size of P_adj utilizing the circuitry in FIG. 6.

FIG. 7 illustrates an exemplary embodiment 700 of a method for increasing the size of PFET utilizing the circuitry in FIG. 6. Note FIG. 7 is shown for illustrative purposes only, and is not meant to limit the scope of the present disclosure.

In FIG. 7, at block 710, during the ON state, NFET may be on or off, and P_adj, including PFET.1 and PFET.2, may be on or off. It will be appreciated that the on/off status of NFET and P_adj may be determined, e.g., by whether the boost converter is in an ON or OFF state.

At block 720, the ON state transitions to the OFF state. In particular, NFET is turned off, and PFET.1 is turned on. With PFET.1 on and PFET.2 off, P_adj has an effective first size Size1. P_adj may be maintained at size Size1 for a predetermined time interval $\Delta t$.

At block 730, PFET.2 is additionally turned on. With PFET.1 and PFET.2 both on, P_adj has an effective second size Size2>Size1.

Note while P_adj is implemented using two parallel-coupled transistors PFET.1 and PFET.2 in FIGS. 6 and 7, one of ordinary skill in the art will appreciate that the techniques herein may readily be applied to implementations wherein more than two parallel-coupled transistors are used. Furthermore, while PFET.1 and PFET.2 are shown as being both turned on at block 730, in alternative exemplary embodiments wherein the size of PFET.2 is greater than the size of PFET.1, PFET.1 may be turned off when PFET.2 is turned on. Such alternative exemplary embodiments are contemplated to be within the scope of the present disclosure.

Figure 8:
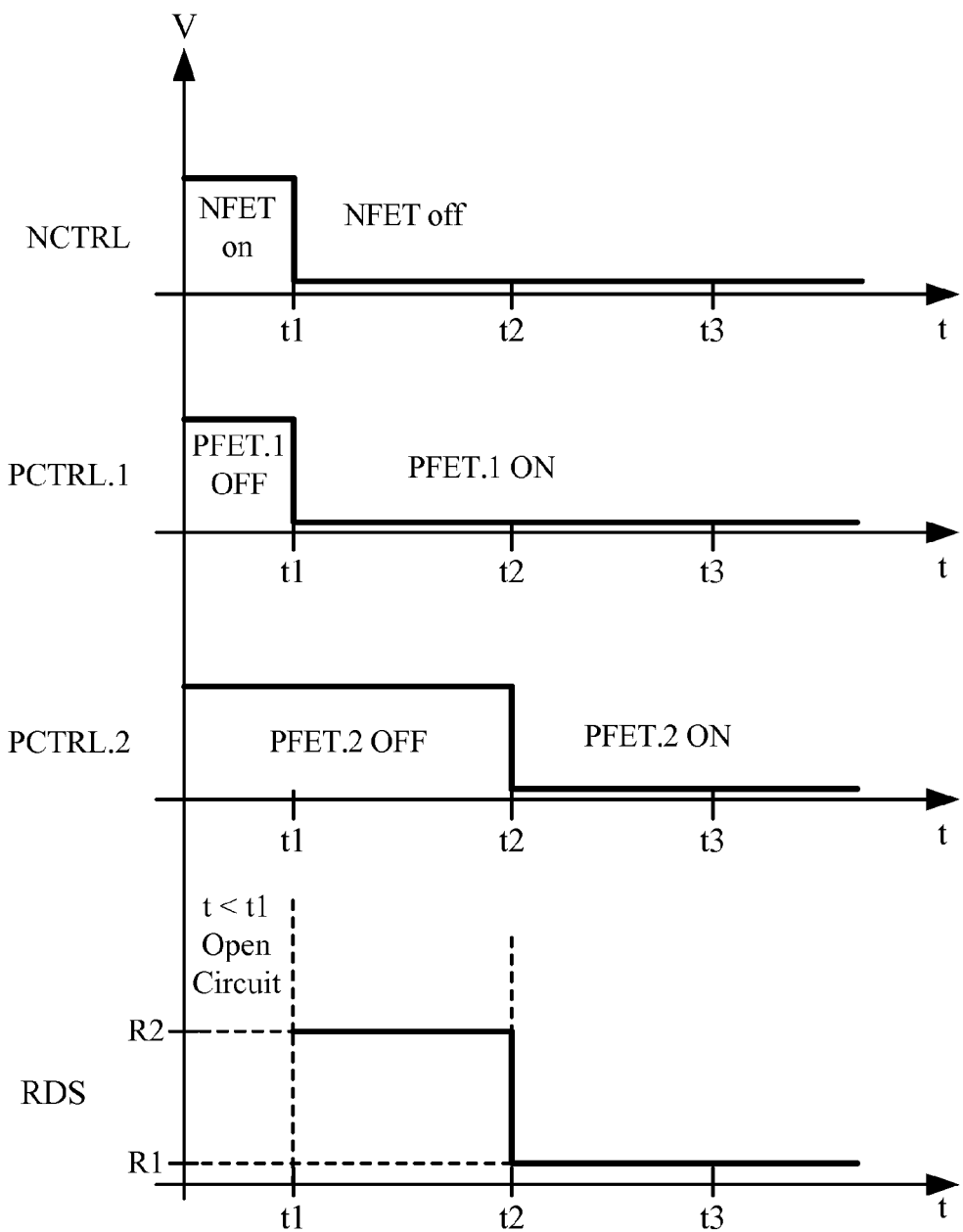
FIG. 8 illustrates exemplary signal waveforms present in an exemplary embodiment of the present disclosure, wherein the size of P_adj is adjusted according to the method in FIG. 7.

FIG. 8 illustrates exemplary signal waveforms present in an exemplary embodiment of the present disclosure, wherein the size of P_adj is adjusted according to the method 700 in FIG. 7. Note FIG. 8 is shown for illustrative purposes only, and is not meant to limit the scope of the present disclosure to any exemplary signal waveforms shown.

In FIG. 8, prior to time t1, NFET is on, and PFET.1 and PFET.2 are off. At time t1, NCTRL is seen to transition from a high to low voltage, such that NFET is turned off at t1. Furthermore, PFET.1 is turned on, due to PCTRL.1 transitioning from high to low. It will be appreciated that this corresponds to the transition from the ON state to the OFF state, as illustrated between blocks 710 and 720 in FIG. 7. At time t2, PCTRL.2 transitions from high to low, and thus both PFET.1 and PFET.2 are turned on. Correspondingly, RDS (of P_adj) is seen to transition from an open circuit prior to t1, to R2 between t1 and t2, to R1 following t2.

Figure 9:
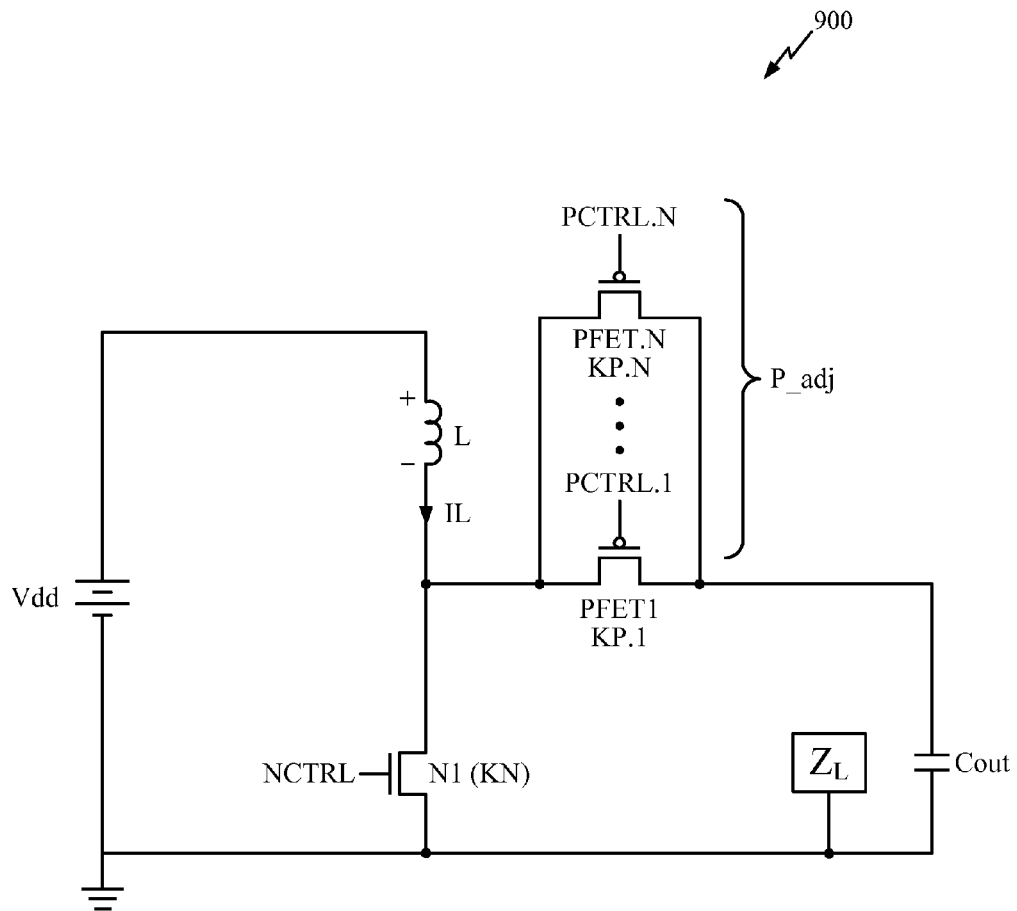
FIG. 9 illustrates an alternative exemplary embodiment 900 of the present disclosure, wherein an arbitrary number of parallel-coupled PMOS transistors are provided to implement P_adj.
Figure 9:
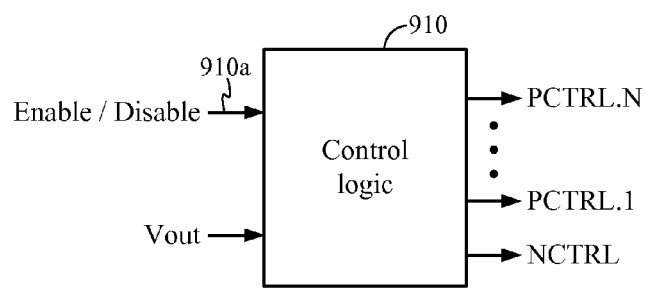

FIG. 9 illustrates an alternative exemplary embodiment 900 of the present disclosure, wherein an arbitrary number of parallel-coupled PMOS transistors are provided to implement P_adj. In particular, in FIG. 9, P_adj includes an arbitrary plurality N of parallel-coupled PMOS transistors PFET.1 through PFET.N with corresponding control voltages PCTRL.1 through PCTRL.N, respectively. Transistors PFET.1 through PFET.N have associated sizes KP.1 through KP.N. In light of the techniques of the present disclosure, it will be appreciated that increasing the size of P_adj may be implemented by successively switching on the transistors PFET.1 through PFET.N, one after the other. However, one of ordinary skill in the art will appreciate that dynamically adjusting the size of P_adj may be implemented using the architecture 900 in other ways as well, and such alternative exemplary embodiments are contemplated to be within the scope of the present disclosure. In certain exemplary embodiments, the sizes of KP.1 through KP.N may all be equal to the same value KP, while in alternative exemplary embodiments, KP.1<KP.2< . . . <KP.N. It will be appreciated that the particular control signaling scheme for PCTRL.1 through PCTRL.N will depend on the relative sizes of the transistors PFET.1 through PFET.N, and one of ordinary skill in the art may readily derive the requisite control signaling scheme in light of the principles disclosed hereinabove.

Figure 10:
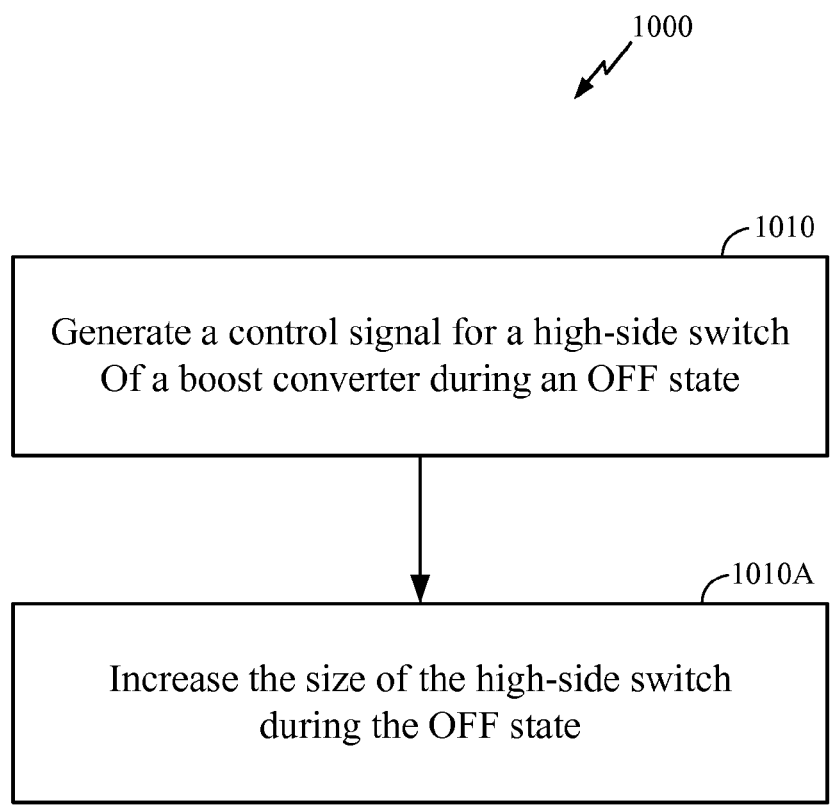
FIG. 10 illustrates an exemplary embodiment of a method according to the present disclosure.

FIG. 10 illustrates an exemplary embodiment 1000 of a method according to the present disclosure. Note FIG. 10 is shown for illustrative purposes only, and is not meant to limit the scope of the present disclosure.

In FIG. 10, at block 1010, a control signal is generated for a high-side switch of a boost converter during an OFF state, the high-side switch having an adjustable size. At block 1010A, the generating the control signal is shown as comprising increasing the size of the high-side switch during the OFF state.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:
1. An apparatus comprising:
a control logic block configured to generate a resistance adjustment signal for a high-side switch of a boost converter, the high-side switch coupling an inductor to a load during an OFF state of the boost converter, wherein the resistance adjustment signal is configured to decrease the resistance of the high-side switch during the OFF state, wherein at a first time, an output voltage is at a first voltage level, wherein following the first time, the output voltage level decreases to a second voltage level, wherein at a second time following the first time, the output voltage begins to increase from the second voltage level, wherein at a third time following the second time, the output voltage is at a third voltage level greater than the second voltage level and less than the first voltage level, and wherein the first time corresponds to the high-side switch entering the OFF state, and wherein the second time corresponds to the resistance adjustment signal decreasing the resistance of the high-side switch during the OFF state.

2. The apparatus of claim 1, wherein the resistance adjustment signal comprises a size adjustment signal, and the size adjustment signal is configured to increase the size of the high-side switch during the OFF state.

3. The apparatus of claim 2, wherein the size adjustment signal is configured to, during the OFF state, set a first size for the high-side switch, followed by a second size greater than the first size.

4. The apparatus of claim 3, wherein the second size is set at a predetermined time interval following the first size being set.

5. The apparatus of claim 2, the high-side switch comprising two parallel-coupled transistors, the size adjustment signal comprising a gate control voltage for each of the two parallel-coupled transistors.

6. The apparatus of claim 5, wherein the gate control voltages are configured to turn on a first of the parallel-coupled transistors, followed by a second of the parallel-coupled transistors.

7. The apparatus of claim 6, wherein the gate control voltages are configured to turn off the first of the parallel-coupled transistors when the second of the parallel-coupled transistors is turned on.

8. The apparatus of claim 1, wherein the resistance adjustment signal is configured to, during the OFF state, continuously decrease the resistance of the high-side switch.

9. The apparatus of claim 1, further comprising the boost converter coupled to the control logic block, the boost converter configured to generate a boosted output voltage, the apparatus further comprising:

an audio amplifier having a supply voltage derived from the boosted output voltage.

10. The apparatus of claim 1, further comprising the boost converter, the boost converter comprising:

the inductor;

the high-side selectively switch coupling the inductor to the load;

a low-side switch selectively coupling the inductor to ground; wherein the control logic block is further configured to generate a control signal for the low-side switch to cause the low-side switch to couple the inductor to ground during an ON state of the boost converter.

11. A method comprising:

generating a control signal for a high-side switch of a boost converter during an OFF state, the high-side switch having an adjustable size, the control signal including a resistance adjustment signal that is configured to decrease the resistance of the high-side switch during the OFF state, the generating the control signal comprising:

increasing the size of the high-side switch during the OFF state, including:

entering, at a first time, the OFF state, wherein at the first time an output voltage is at a first voltage level, decreasing the output voltage level to a second voltage level following the first time, decreasing, at a second time following the first time, the resistance of the high-side switch during the OFF state, wherein at the second time the output voltage begins to increase from the second voltage level, and increasing, at a third time following the second time, the output voltage to a third voltage level greater than the second voltage level and less than the first voltage level.

12. The method of claim 11, the increasing the size comprising:

setting a first size for the high-side switch; and subsequent to the setting the first size, setting a second size for the high-side switch greater than the first size.

13. The method of claim 12, the setting the second size following the setting the first size by a predetermined time interval.

14. The method of claim 11, the high-side switch comprising a plurality of parallel-coupled transistors, the setting the first size comprising turning on a first of the plurality of parallel-coupled transistors, the setting the second size comprising turning on a second of the plurality of parallel-coupled transistors.

15. The method of claim 11, the increasing the size further comprising:

subsequent to the setting the second size, setting a third size for the high-side switch greater than the second size.

16. An apparatus comprising:

means for generating a control signal for a high-side switch of a boost converter during an OFF state, the high-side switch having an adjustable size, the control signal including a resistance adjustment signal that is configured to decrease the resistance of the high-side switch during the OFF state, the generating the control signal comprising:

means for increasing the size of the high-side switch during the OFF state, including:

means for entering, at a first time, the OFF state, wherein at the first time an output voltage is at a first voltage level, means for decreasing the output voltage level to a second voltage level following the first time, means for decreasing, at a second time following the first time, the resistance of the high-side switch during the OFF state, wherein at the second time the output voltage begins to increase from the second voltage level, and means for increasing, at a third time following the second time, the output voltage to a third voltage level greater than the second voltage level and less than the first voltage level.

17. The apparatus of claim 16, the means for increasing the size comprising:

means for setting a first size for the high-side switch; and means for, subsequent to the setting the first size, setting a second size for the high-side switch greater than the first size.

18. The apparatus of claim 17, setting the second size following the setting the first size by a predetermined time interval.

19. The apparatus of claim 16, the high-side switch comprising a plurality of parallel-coupled transistors, the means for setting the first size comprising means for turning on a first of the plurality of parallel-coupled transistors, the means for setting the second size comprising means for turning on a second of the plurality of parallel-coupled transistors.

20. The apparatus of claim 16, the means for increasing the size further comprising:
   means for, subsequent to the setting the second size, setting a third size for the high-side switch greater than the second size.

* * * * *